United States Patent
Mitani et al.

(10) Patent No.: US 7,855,910 B2
(45) Date of Patent: Dec. 21, 2010

(54) ELECTRIC ELEMENT, MEMORY DEVICE, AND SEMICONDUCTOR INTEGRATED CIRCUIT

(75) Inventors: Satoru Mitani, Osaka (JP); Koichi Osano, Osaka (JP); Shunsaku Muraoka, Osaka (JP); Kumio Nago, Nara (JP)

(73) Assignee: Panasonic Corporation, Osaka (JP)

( * ) Notice: Subject to any disclaimer, the term of this patent is extended or adjusted under 35 U.S.C. 154(b) by 349 days.

(21) Appl. No.: 12/088,295

(22) PCT Filed: Jan. 19, 2007

(86) PCT No.: PCT/JP2007/050809

§ 371 (c)(1),
(2), (4) Date: Mar. 27, 2008

(87) PCT Pub. No.: WO2007/086325

PCT Pub. Date: Aug. 2, 2007

(65) Prior Publication Data

US 2010/0002490 A1    Jan. 7, 2010

(30) Foreign Application Priority Data

Jan. 24, 2006   (JP) .............................. 2006-014940

(51) Int. Cl.
*G11C 11/00*   (2006.01)

(52) U.S. Cl. ....................... 365/148; 365/158; 365/159; 365/174; 365/230.06

(58) Field of Classification Search ................ 365/148, 365/159, 158, 174, 230.06

See application file for complete search history.

(56) References Cited

U.S. PATENT DOCUMENTS

| | | | |
|---|---|---|---|
| 6,204,139 B1 * | 3/2001 | Liu et al. | 438/385 |
| 6,531,371 B2 * | 3/2003 | Hsu et al. | 438/385 |
| 6,673,691 B2 * | 1/2004 | Zhuang et al. | 438/382 |
| 7,459,716 B2 * | 12/2008 | Toda et al. | 257/2 |

(Continued)

FOREIGN PATENT DOCUMENTS

JP    2002-111094    4/2002

(Continued)

OTHER PUBLICATIONS

Gerstner, E. G., et al., "Nonvolatile memory effects in nitrogen doped tetrahedral amorphous carbon thin films," Journal of Applied Physics, Nov. 15, 1998, p. 5647-5651, vol. 84, No. 10, American Institute of Physics.

*Primary Examiner*—Pho M Luu
(74) *Attorney, Agent, or Firm*—McDermott Will & Emery LLP

(57) ABSTRACT

A memory device including a plurality of electric elements corresponding to a plurality of transistors on a one-to-one basis; a word line driver for driving a plurality of word lines; and a bit line/plate line driver for driving a plurality of bit lines and a plurality of plate lines. Each of the plurality of electric elements includes a first electrode connected to one of the transistors corresponding to the electric element, a second electrode connected to one of the plate lines corresponding to the electric element, and a variable-resistance film connected between the first electrode and the second electrode, and the variable-resistance film includes $Fe_3O_4$ as a constituent element and has a crystal grain size of 5 nm to 150 nm.

10 Claims, 12 Drawing Sheets

U.S. PATENT DOCUMENTS

| | | | |
|---|---|---|---|
| 7,525,832 B2 * | 4/2009 | Muraoka et al. | 365/148 |
| 7,577,022 B2 * | 8/2009 | Muraoka et al. | 365/159 |
| 2002/0036315 A1 | 3/2002 | Adachi et al. | |
| 2005/0040482 A1 | 2/2005 | Suzuki et al. | |
| 2005/0168887 A1 | 8/2005 | Yuasa et al. | |

FOREIGN PATENT DOCUMENTS

| | | |
|---|---|---|
| JP | 2004-273656 | 9/2004 |
| JP | 2004-342843 | 12/2004 |
| JP | 2005-191312 | 7/2005 |
| WO | WO 2005/101420 A1 | 10/2005 |

* cited by examiner

ELECTRIC ELEMENT, MEMORY DEVICE, AND SEMICONDUCTOR INTEGRATED CIRCUIT

RELATED APPLICATIONS

This application is the U.S. National Phase under 35 U.S.C. §371 of International Application No. PCT/JP2007/050809, filed on Jan. 19, 2007, which in turn claims the benefit of Japanese Application No. 2006-014940, filed on Jan. 24, 2006, the disclosures of which Applications are incorporated by reference herein.

1. Technical Field

The present invention relates to an electric element, memory device, and semiconductor integrated circuit formed using a state-variable material whose resistance value changes according to an applied electric pulse.

2. Background Art

In recent years, along with the advancement of the digital techniques in electronic devices, demands for nonvolatile memory devices have been increasing for storage of data, such as a picture, and the like. Further, demands for increasing the capacity of a memory device, reducing the write power, shortening the read and write times, and prolonging the device's life have been escalating. To meet such demands, U.S. Pat. No. 6,204,139 (Patent Document 1) discloses a technique for forming a nonvolatile memory device using a perovskite material whose resistance value varies according to an applied electric pulse (e.g., $Pr_{(1-x)}Ca_xMnO_3$(PCMO), $LaSrMnO_3$(LSMO), $GdBaCo_xO_Y$(GBCO), etc.). According to the technique disclosed in this publication, a predetermined electric pulse is applied to these materials (hereinafter, generically referred to as "variable-resistance material(s)") to increase or decrease the resistance value of the materials. The resistance value which has varied as a result of application of the pulse is used for memorization of different values. Based on this scheme, the materials are used for memory devices.

Perovskite materials have been disclosed in U.S. Pat. No. 6,204,139 as a material whose resistance value varies according to an electric pulse. Also, a memory device has been proposed wherein a deep acceptor level and shallow donor level of an amorphous carbon film are used to vary the resistance by injection of charge (J. Appl. Phys., Vol. 84, (1998), p5647).

Japanese Laid-Open Patent Publication No. 2004-342843 (Patent Document 2) discloses a technique relating to a nonvolatile memory device wherein a voltage is applied to an electrode formed of Ag or Cu on an amorphous oxide (e.g., an oxide formed by one or more elements selected from Ti, V, Fe, Co, Y, Zr, Nb, Mo, Hf, Ta, W, Ge, and Si) such that Ag or Cu, which is the material of the electrode, is ionized and diffused in a thin film, whereby the resistance value of the amorphous oxide is varied.

[Patent Document 1] U.S. Pat. No. 6,204,139
[Patent Document 2] Japanese Laid-Open Patent Publication No. 2004-342843
[Non-Patent Document] J. Appl. Phys., Vol. 84, (1998), p5647

DISCLOSURE OF INVENTION

Problems to be Solved by the Invention

In the formation of a memory device using such a variable-resistance material, it is desirable that in CMOS process the substrate temperature for film formation is 450° C. or lower for the purpose of avoiding a high-temperature collapse, or the like. However, to form a film of a perovskite structure, it is in general necessary to set the substrate temperature for film formation to 700° C. or higher.

In the case where a variable-resistance material, such as a perovskite material, is used for a memory device, it is desirable that the change in resistance caused by application of a predetermined electric pulse is stable (the magnitude of the change in resistance is constant).

An objective of the present invention is to achieve stable change in resistance. More specifically, an objective of the present invention is to provide an electric element where the change in resistance is stable even after repetitive application of an electric pulse, and a memory device and semiconductor integrated circuit which utilize the electric element.

Means for Solving the Problems

According to one aspect of the present invention, an electric element includes, a first electrode, a second electrode, and a variable-resistance film. The variable-resistance film is connected between the first electrode and the second electrode. The variable-resistance film includes $Fe_3O_4$ as a constituent element. The variable-resistance film has a crystal grain size of 5 nm to 150 nm.

The present inventors found that an electric element having a variable-resistance film which includes $Fe_3O_4$ as a constituent element and has a crystal grain size of 5 nm to 150 nm exhibits stable changes in resistance. Therefore, when such an electric element is used as, for example, a memory device, stable recording and reproduction can be achieved as compared with the prior art. The material of the variable-resistance film is not amorphous but has a microcrystalline structure. Therefore, variations in characteristics are unlikely to occur even after hours of use as compared with the prior art.

The variable-resistance film may include a $Fe_3O_4$ crystal phase and a $Fe_2O_3$ crystal phase and have a crystal grain size of 5 nm to 150 nm.

Preferably, the variable-resistance film has a thickness of 200 nm or less.

Preferably, at least one of the first electrode and the second electrode is an electrode including any one of Ag, Au, Pt, Ru, $RuO_2$, Ir, and $IrO_2$.

Preferably, a predetermined electric pulse is applied between the first electrode and the second electrode such that a resistance value of the electric element is changed, whereby one-bit or multibit information is recorded in the electric element.

Preferably, a predetermined voltage is applied between the first electrode and the second electrode such that a current flows according to a resistance value of the electric element, whereby one-bit or multibit information is read out of the electric element.

According to another aspect of the present invention, a memory device includes: a plurality of word lines; a plurality of bit lines; a plurality of plate lines corresponding to the plurality of bit lines on a one-to-one basis; a plurality of transistors; a plurality of electric elements corresponding to the plurality of transistors on a one-to-one basis; a word line driver for driving the plurality of word lines; and a bit line/plate line driver for driving the plurality of bit lines and the plurality of plate lines. Each of the plurality of transistors and one of the electric elements corresponding to the transistor are connected in series between any one of the plurality of bit lines and one of the plate lines corresponding to the bit line. Each of the plurality of transistors is connected between one of the bit lines corresponding to the transistor and one of the electric elements corresponding to the transistor, the transistor having a gate connected to any one of the plurality of word lines. Each of the plurality of electric elements includes a first electrode, a second electrode, and a variable-resistance film. The first electrode is connected to one of the transistors corresponding to the electric element. The second electrode is connected to one of the plate lines corresponding to the electric element. The variable-resistance film is connected between the first electrode and the second electrode. The variable-resistance film includes $Fe_3O_4$ as a constituent element and has a crystal grain size of 5 nm to 150 nm.

In the above-described memory device, the change in resistance of the memory (electric element) is stable so that stable memorization and reproduction can be achieved. The material of the variable-resistance film of the memory is not amorphous but has a microcrystalline structure. Therefore, the reliability of the memory as a memory array can be maintained even after hours of use as compared with the prior art.

The variable-resistance film may include a $Fe_3O_4$ crystal phase and a $Fe_2O_3$ crystal phase and have a crystal grain size of 5 nm to 150 nm.

Preferably, in order to memorize information in any one of the plurality of electric elements, the word line driver applies an activation voltage to one of the plurality of word lines connected to an electric element in which the information is to be memorized. The bit line/plate line driver applies a first electric pulse to one of the plurality of bit lines connected to the electric element in which the information is to be memorized and applies a second electric pulse to one of the plate lines corresponding to the bit line.

In the above-described memory device, a predetermined electric pulse is applied only to an electric element in which information is to be memorized. Therefore, the information can be written in the electric element.

Preferably, in order to reproduce information memorized in any one of the plurality of electric elements, the word line driver applies an activation voltage to one of the plurality of word lines connected to an electric element from which the information is to be retrieved. The bit line/plate line driver applies a first reproduction voltage to one of the plurality of bit lines connected to the electric element from which the information is to be retrieved and applies a second reproduction voltage to one of the plate lines corresponding to the bit line.

In the above-described memory device, a predetermined voltage is applied only to an electric element from which information is to be retrieved. Therefore, the information can be retrieved from the electric element.

According to still another aspect of the present invention, a semiconductor integrated circuit includes: the above-described memory device; and a logic circuit which performs a predetermined operation. The logic circuit has a memorization mode and a reproduction mode. In the memorization mode, the logic circuit stores bit data in the memory device. In the reproduction mode, the logic circuit retrieves bit data stored in the memory device.

According to still another aspect of the present invention, a semiconductor integrated circuit includes: the above-described memory device; and a processor which has a program execution mode and a program rewrite mode. In the program execution mode, the processor operates according to a program stored in the memory device. In the program rewrite mode, the processor rewrites a program stored in the memory device to another new program received from outside.

Effects of the Invention

As described above, stable change in resistance can be achieved.

DESCRIPTION OF REFERENCE NUMERALS

Figure 1:
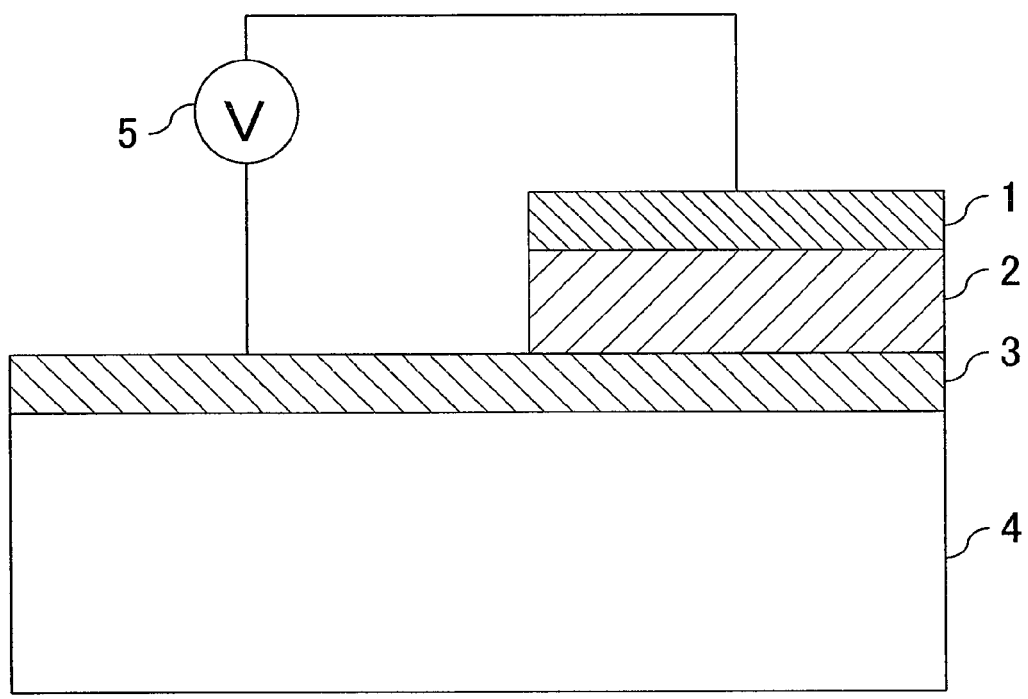
FIG. 1 shows a basic structure of an electric element.

1 Upper electrode
2 Variable-resistance film
3 Lower electrode
4 Substrate
5 Power supply
101-1, 101-2 Terminals
102 Electric element
200 Memory device
201 Memory array
202 Address buffer
203 Control section
204 Row decoder
205 Word line driver
206 Column decoder
207 Bit line/plate line driver
MC211, MC212, MC221, MC222 Memory cells
W1, W2 Word lines
B1, B2 Bit lines
P1, P2 Plate lines
300 Semiconductor integrated circuit
301 Logic circuit 400 Semiconductor integrated circuit
401 Processor
402 Interface

BEST MODE FOR CARRYING OUT THE INVENTION

Hereinafter, embodiments of the present invention are described in detail with reference to the drawings. Throughout the drawings, like elements are denoted by like reference numerals, and the descriptions thereof are not repeated.

(Basic Structure and Basic Characteristics of Electric Element)

The basic structure and basic characteristics of an electric element used in the embodiments are described.

FIG. 1 shows a basic structure of the electric element. The electric element includes a substrate 4, a lower electrode 3 formed on the substrate 4, a variable-resistance film 2 formed on the lower electrode 3, and an upper electrode 1 formed on the variable-resistance film 2. A power supply 5 applies a predetermined voltage between the upper electrode 1 and the lower electrode 3. Application by the power supply 5 of a voltage which meets a predetermined condition increases/decreases the resistance value of the electric element. For example, application of an electric pulse having a voltage value greater than a certain threshold decreases the resistance value of the electric element. On the other hand, application of a voltage having a voltage value smaller than the threshold (voltage which does not meet the predetermined condition) does not affect the change in resistance of the electric element (namely, the resistance value of the electric element does not vary).

A material having a lower work function is more preferable as the material used for the upper electrode 1 and the lower electrode 3. For example, Ag, Au, Pt, Ru, $RuO_2$, Ir, and $IrO_2$ are preferable. It should be noted however that, considering that the substrate 4 is, in the common procedure, heated for the formation of the variable-resistance film 2, the material used for the lower electrode 3 is desirably stable at the temperature of this heating.

The thickness of the variable-resistance film 2 is preferably 1 μm or less. With the thickness of the variable-resistance film 2 being 1 μm or less, it is sufficiently possible to change the resistance value of the electric element by an electric pulse.

The thickness of the variable-resistance film 2 is preferably 200 nm or less. This is because, in a lithography step in the production process, the variable-resistance film 2 is processed more easily as it is thinner. Also, as the variable-resistance film 2 is thinner, the resistance value of the electric element can be changed by an electric pulse of a lower voltage value.

The variable-resistance film 2 of the embodiments contains $Fe_3O_4$ as a constituent element. The crystal grain size of $Fe_3O_4$ is in the range of 5 nm to 150 nm. Alternatively, the variable-resistance film 2 of the embodiments contains $Fe_3O_4$ crystal phase and $Fe_2O_3$ crystal phase. The crystal grain size of these crystal phases is in the range of 5 nm to 150 nm.

Hereinafter, the reasons for use of such a variable-resistance film will be described with the examples of three electric elements (electric element (A), electric element (B), electric element (C)).

<Fabrication of Electric Elements>

As shown in FIG. 1, the lower electrode 3 was formed on the substrate 4. Then, sputtering was performed using $Fe_3O_4$ as a target to form the variable-resistance film 2 on the lower electrode 3. Then, the upper electrode 1 was formed on the variable-resistance film 2. In such a way, electric element (A), electric element (B), and electric element (C) were fabricated.

In the fabrication of electric element (A), the variable-resistance film 2 was formed by sputtering without mixing oxygen into Ar gas. In the fabrication of electric element (B), the variable-resistance film 2 was formed by sputtering with oxygen mixed into Ar gas at the oxygen partial pressure of "5%". In the fabrication of electric element (C), the variable-resistance film 2 was formed by sputtering with oxygen mixed into Ar gas at the oxygen partial pressure of "1.2%".

<X-Ray Diffraction>

The variable-resistance film of each of electric element (A), electric element (B), and electric element (C) was subjected to X-ray diffraction analysis to measure the diffraction peak.

Figure 2:
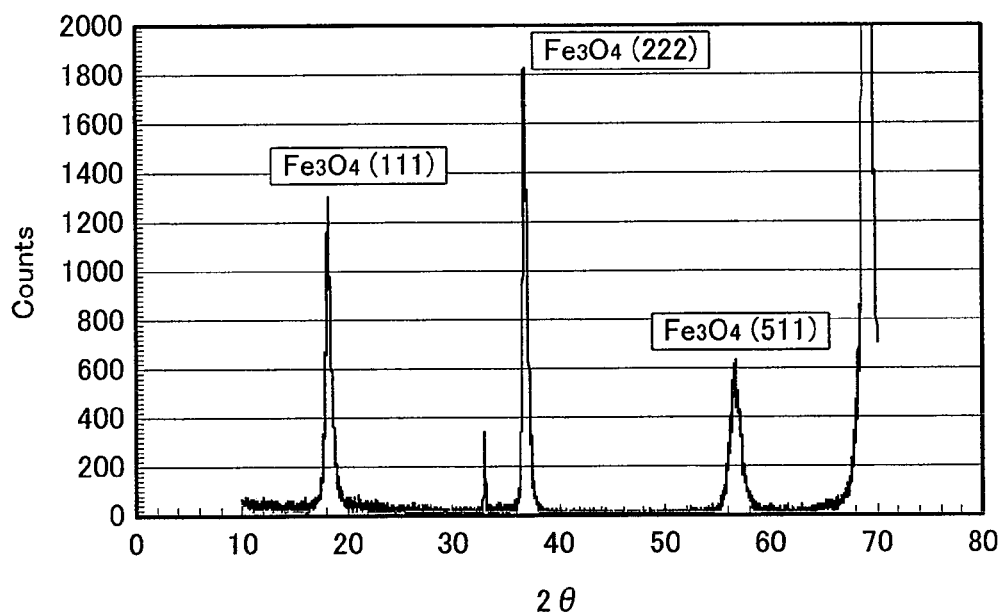
FIG. 2 is a graph showing the diffraction pattern of film (A).

The X-ray diffraction analysis on the variable-resistance film of electric element (A) resulted in the chart of FIG. 2 where a diffraction peak corresponding to (111) of $Fe_3O_4$ was detected at diffraction angle $2\theta=18.2°$, a diffraction peak corresponding to (222) of $Fe_3O_4$ was detected at diffraction angle $2\theta=36.8°$, and a diffraction peak corresponding to (511) of $Fe_3O_4$ was detected at diffraction angle $2\theta=56.8°$. Thus, in electric element (A), $Fe_3O_4$ diffraction peaks having large diffraction peak intensity and small half width were detected.

Figure 3:
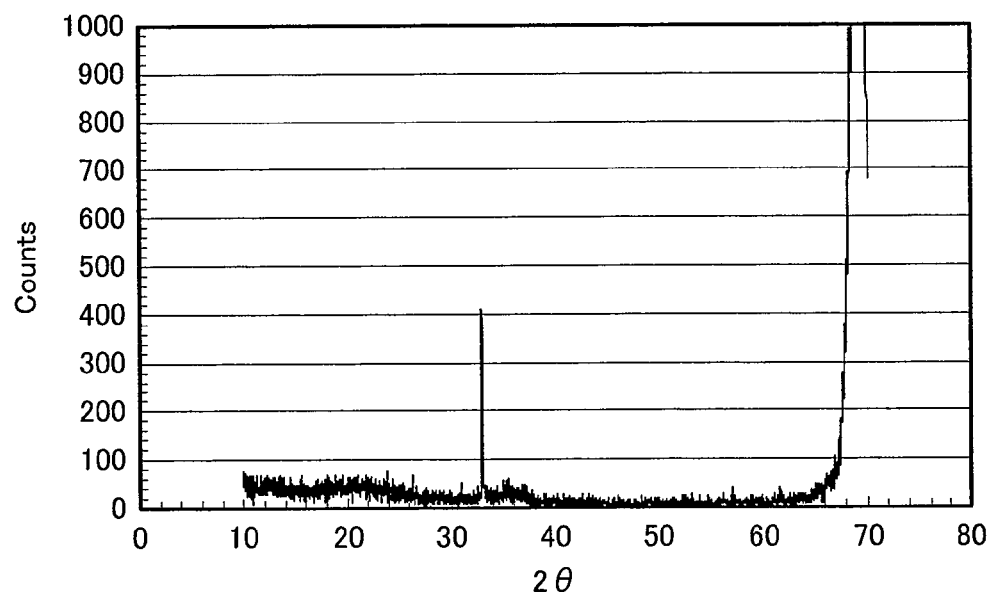
FIG. 3 is a graph showing the diffraction pattern of film (B).

The X-ray diffraction analysis on the variable-resistance film of electric element (B) resulted in the chart of FIG. 3 where a broader diffraction peak having small diffraction peak intensity was detected.

Figure 4:
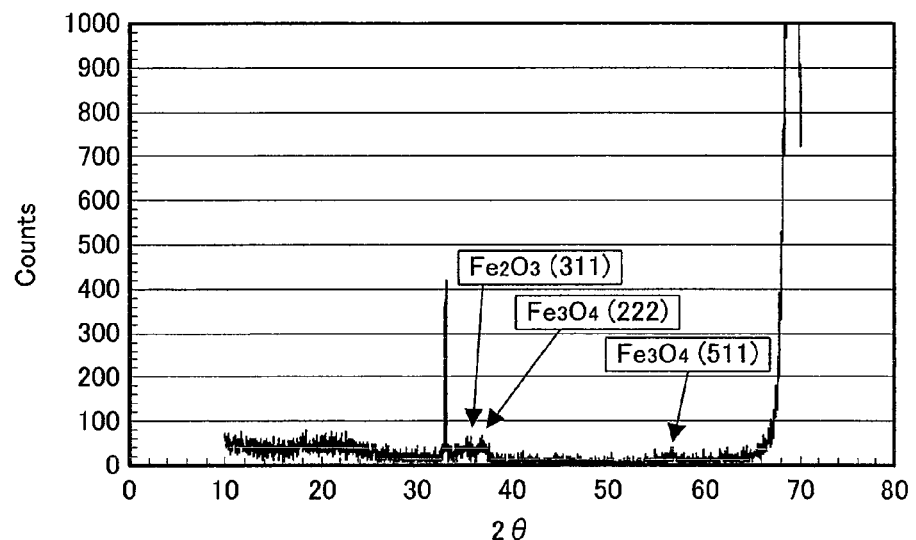
FIG. 4 is a graph showing the diffraction pattern of film (C).

The X-ray diffraction analysis on the variable-resistance film of electric element (C) resulted in the chart of FIG. 4 where a diffraction peak corresponding to (311) of $Fe_2O_3$ was detected at diffraction angle $2\theta=35°$, a diffraction peak corresponding to (222) of $Fe_3O_4$ was detected at diffraction angle $2\theta=36.8°$, and a diffraction peak corresponding to (511) of $Fe_3O_4$ was detected at diffraction angle $2\theta=56.8°$. Thus, in electric element (C), $Fe_3O_4$ diffraction peaks which had diffraction peak intensity larger than that of electric element (B) but smaller than that of electric element (A) were detected.

It was found from the above results that the crystallinity of the variable-resistance film of electric element (C) was worse than that of electric element (A) but better than that of electric element (B).

For each of electric element (A), electric element (B), and electric element (C), the crystal grain size of the variable-resistance film was calculated from the half width of the diffraction peak of the electric element using the Scherrer formula show below:

$$D = K \times \lambda / (\beta \times \cos \theta)$$

D: crystal grain size K: 0.9 (constant) λ: wavelength of X-ray

β: half width of diffraction peak θ: Bragg angle

The result of the calculation exhibited that the crystal grain size of the variable-resistance film of electric element (C) was smaller than that of electric element (A) but larger than that of electric element (B).

<Experiments>

Two types of electric pulses (positive and negative pulses) were alternately applied to each of electric element (A), electric element (B) and electric element (C) as fabricated above. The resistance value of the electric element was measured upon every single application of the electric pulses. It should be noted that a "positive pulse" means an electric pulse which was to make the upper electrode 1 "positive" with respect to the lower electrode 3 and a "negative pulse" means an electric pulse which was to make the upper electrode 1 "negative" with respect to the lower electrode 3. It should also be noted herein that a measurement voltage (voltage which does not affect the change in resistance of the electric element; herein, 0.5 V) was applied between the upper electrode 1 and the lower electrode 3 in order to measure the resistance value of the electric element. Namely, the voltage value of the measurement voltage and the current value of a current that flowed when the measurement voltage was applied were used to calculate the resistance value of the electric element.

<Measurement Results of Electric Element (A)>

Positive pulse: voltage value "+1.6 V", pulse width "100 ns"

Negative pulse: voltage value "−1.1 V", pulse width "100 ns"

Figure 5:
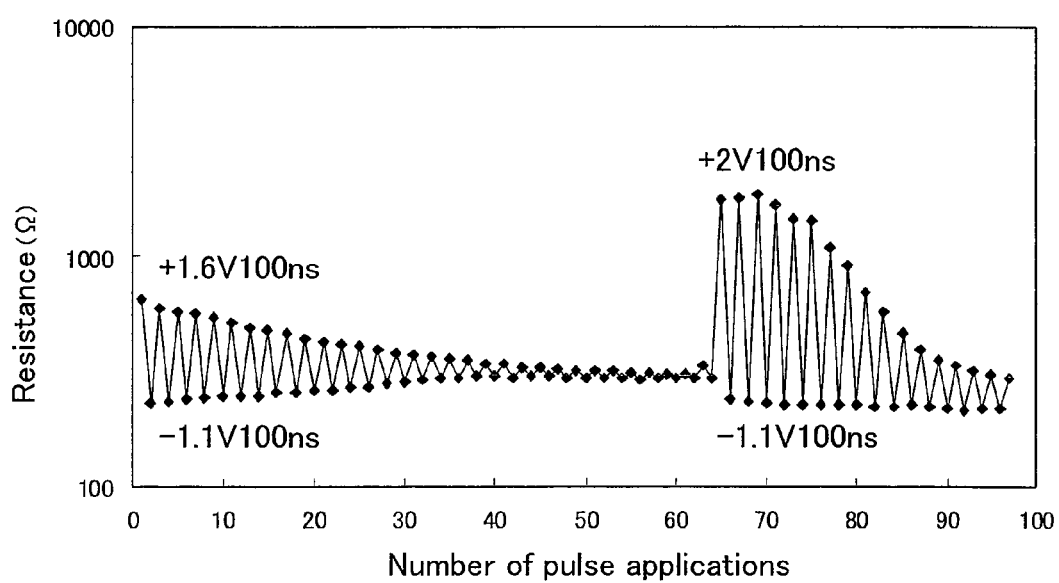
FIG. 5 is a graph showing the change in resistance of an electric element which includes film (A).

As seen from FIG. 5, the resistance value of electric element (A) was initially decreased by application of the negative pulse from about 0.7 kΩ to about 0.25 kΩ (by about 0.45 kΩ) and then increased by application of the positive pulse from about 0.25 kΩ to about 0.6 kΩ (by about 0.35 kΩ). However, as the number of applications of electric pulses increased, the increment/decrement of the resistance value of electric element (A) produced by application of one electric pulse became smaller. After the 40th application, the resistance value of electric element (A) was rarely varied by application of the electric pulse.

The 65th pulse applied was a positive pulse of "+2 V", which was higher than the previous positive pulses of "+1.6 V". As a result of application of the 65th pulse, the resistance value of electric element (A) again changed from about 0.3 kΩ to about 2 kΩ. The 66th application with the negative pulse resulted in a change in resistance value of electric element (A) from about 2 kΩ to about 0.25 kΩ. Thereafter, electric pulses of such an increased voltage value were applied, but nevertheless, the increment/decrement produced by application of such an electric pulse became smaller as the number of applications of electric pulses increased.

Thus, the resistance value of electric element (A) was increased/decreased by application of an electric pulse of about several volts. However, the increment/decrement of the resistance became smaller as the number of applications of electric pulses increased.

<Measurement Results of Electric Element (B)>

Positive pulse: voltage value "+4 V", pulse width "100 ns"
Negative pulse: voltage value "−4 V", pulse width "100 ns"

Figure 6:
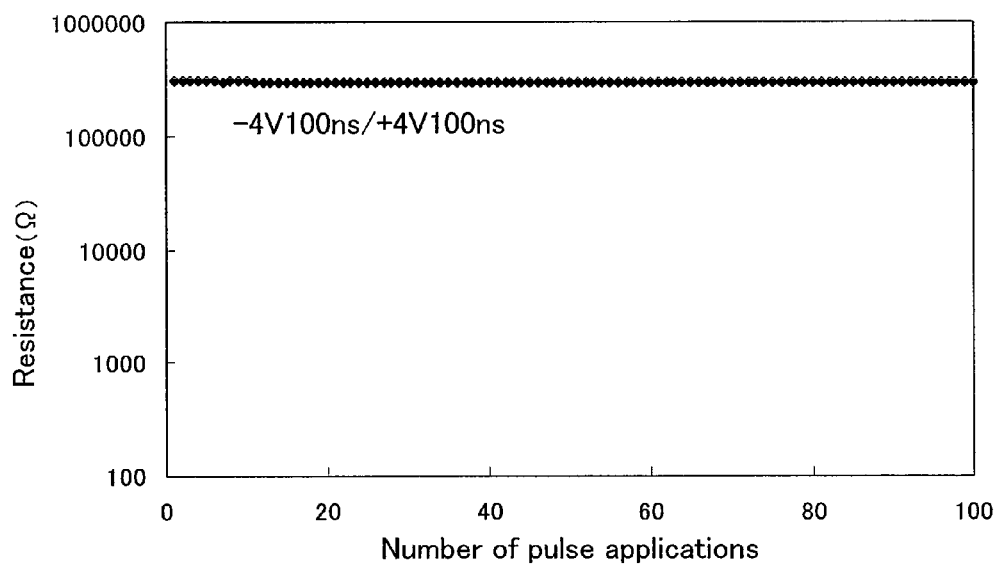
FIG. 6 is a graph showing the change in resistance of an electric element which includes film (B).

As seen from FIG. 6, the resistance value of electric element (B) was rarely varied by application of electric pulses. Thus, electric element (B) did not cause any substantial change in resistance even with application of electric pulses.

<Measurement Results of Electric Element (C)>

Positive pulse: voltage value "+2 V", pulse width "100 ns"
Negative pulse: voltage value "−2.4 V", pulse width "100 ns"

Figure 7:
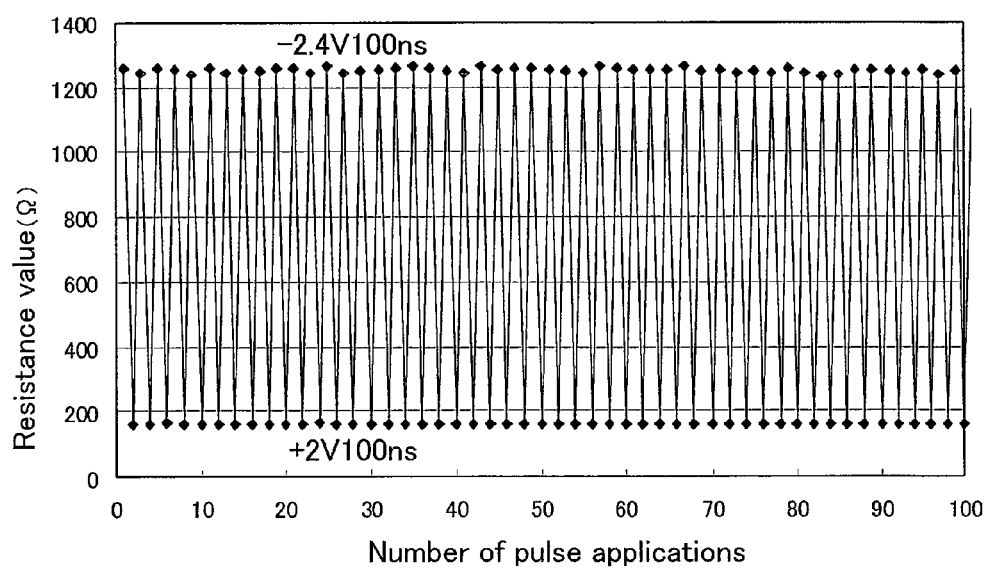
FIG. 7 is a graph showing the change in resistance of an electric element which includes film (C).

As seen from FIG. 7, the resistance value of electric element (C) was decreased by application of the positive pulse from about 1.25 kΩ to about 0.15 kΩ (by about 1.1 kΩ) but, on the other hand, increased by application of the negative pulse from about 0.15 kΩ to about 1.25 kΩ (by about 1.1 kΩ). In the case of electric element (C), even if the number of applications of electric pulses increased, the change in resistance by about 1.1 kΩ continually occurred (i.e., changes in resistance of substantially equal magnitudes occurred many times).

Thus, it was found that the resistance value of electric element (C) is increased/decreased by application of an electric pulse of about several volts. It was found that, as compared with electric element (A), electric element (C) exhibits stable (constant) changes in resistance according to applied electric pulses (the magnitudes of changes in resistance are substantially equal) even if the number of applications of electric pulses increases.

Thus, it was found for the variable-resistance film that stable changes in resistance cannot be achieved when the crystal grain size is too large and that a change in resistance is unlikely to occur when the crystal grain size is too small.

Figure 8:
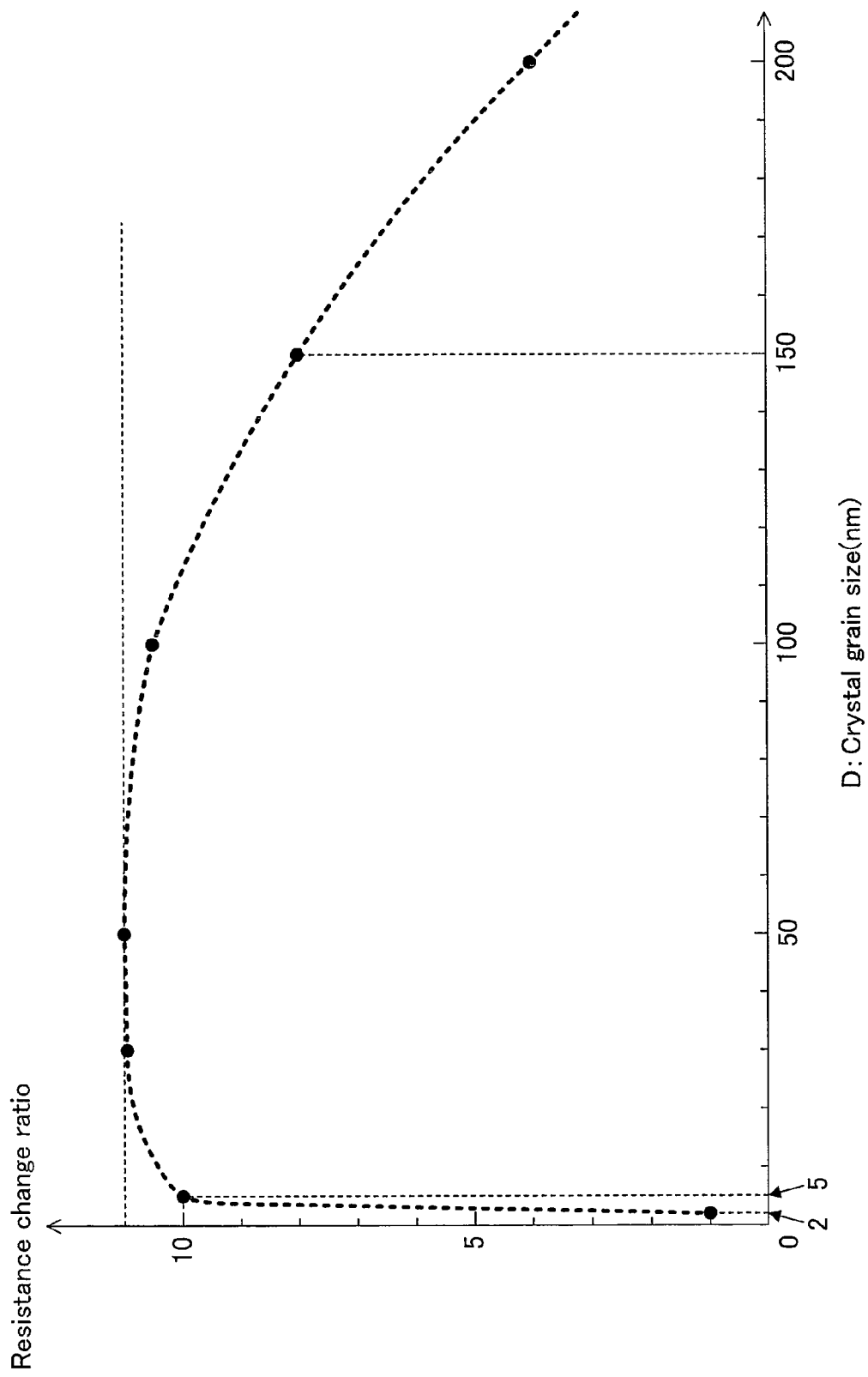
FIG. 8 is a graph showing the relationship between the crystal grain size and resistance change ratio of a variable-resistance film.

We prepared a plurality of variable-resistance films having different crystal grain sizes and measured the resistance change ratio (ratio of high resistance value to low resistance value of electric element) of each of the variable-resistance films. As seen from FIG. 8, it was found that the resistance change ratio is as low as about one time (1:1) when the crystal grain size is 2 nm and, however, that when the crystal grain size is in the range from 5 nm to 150 nm a stable resistance change ratio of about eight times (8:1) to ten times (10:1) or higher can be achieved.

To verify whether or not an electric element in which the variable-resistance film 2 includes both $Fe_3O_4$ crystal phase and $Fe_2O_3$ crystal phase have the same characteristics as those described above, we prepared three types of electric elements having different crystal grain sizes and carried out the above-described experiments on these electric elements. The results of the experiments exhibited that, even in the case where the variable-resistance film 2 includes $Fe_3O_4$ crystal phase and $Fe_2O_3$ crystal phase, an electric element having a crystal grain size of 5 nm to 150 nm achieves a stable resistance change ratio.

Embodiment 1

<Definition of Graphical Symbol>

Figure 9:
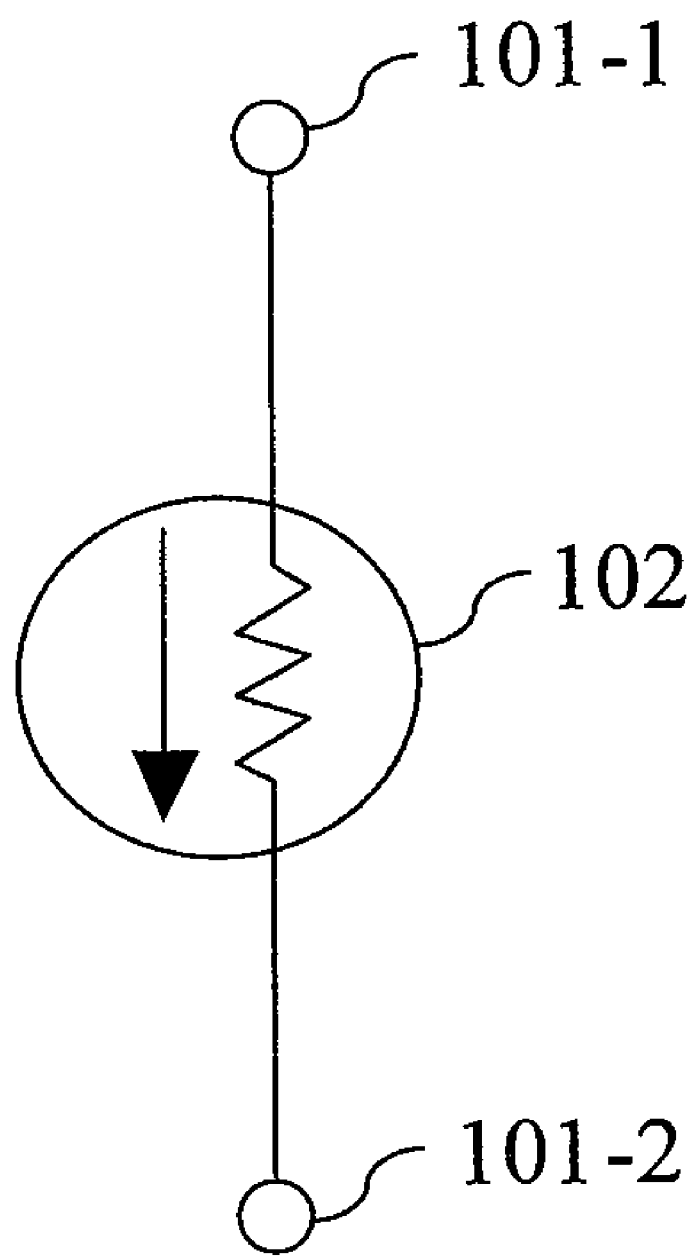
FIG. 9 shows a graphical symbol of an electric element according to embodiment 1 of the present invention.

An electric element of embodiment 1 of the present invention is described. We define the graphical symbol of the electric element of embodiment 1 as shown in FIG. 9. In FIG. 9, the upper electrode 1 of FIG. 1 is connected to a terminal 101-1, while the lower electrode 3 of FIG. 1 is connected to a terminal 101-2.

Figure 10:
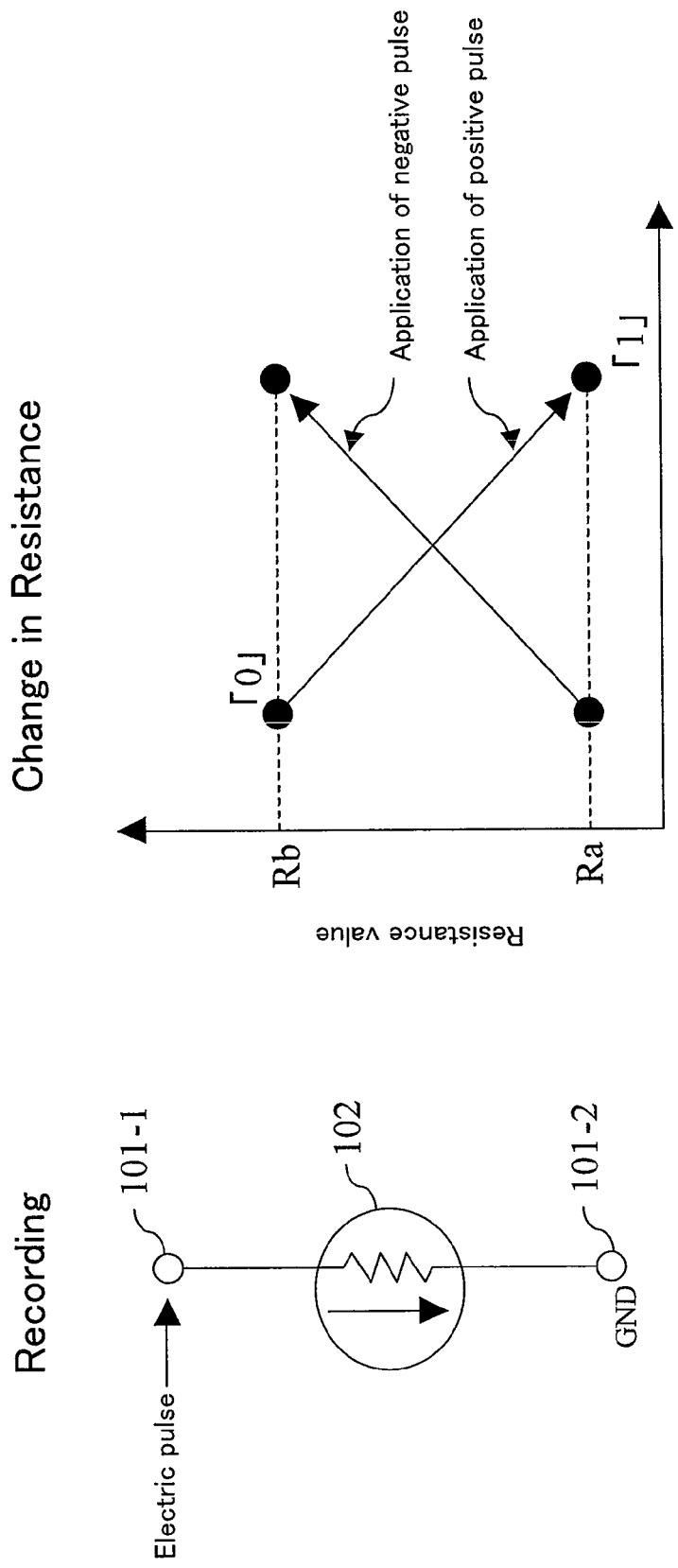
FIG. 10 illustrates the change in resistance of the electric element shown in FIG. 9.

Referring to FIG. 10, when an electric pulse (positive pulse) which is to make the terminal 101-1 positive with respect to the terminal 101-2 is applied to an electric element 102, the resistance value of the electric element 102 decreases. On the contrary, when an electric pulse (negative pulse) which is to make the terminal 101-1 negative with respect to the terminal 101-2 is applied to the electric element 102, the resistance value of the electric element 102 increases. Namely, when an electric pulse is applied such that a current flows in the direction of the arrow, the resistance value of the electric element 102 decreases. On the contrary, when an electric pulse is applied such that a current flows in the direction opposite to the arrow, the resistance value of the electric element 102 increases.

Figure 11:
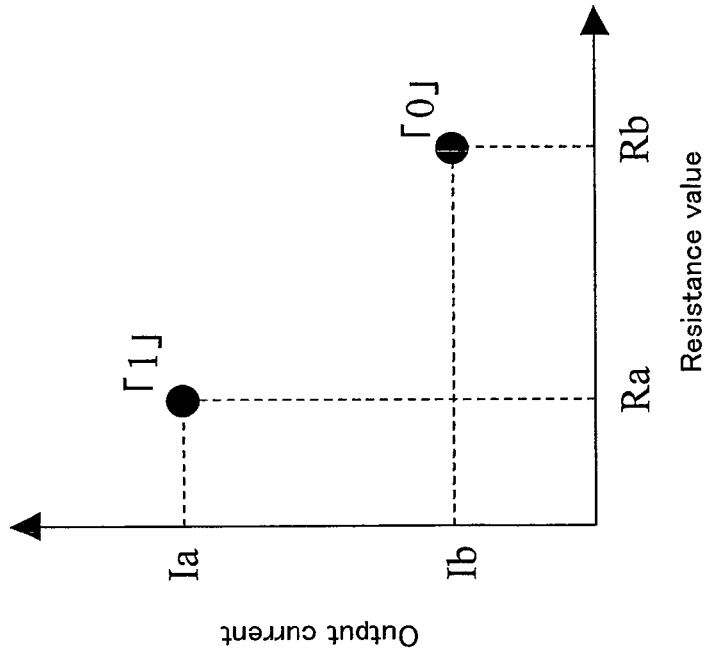
FIG. 11 illustrates an output current of the electric element shown in FIG. 9.
Figure 11:
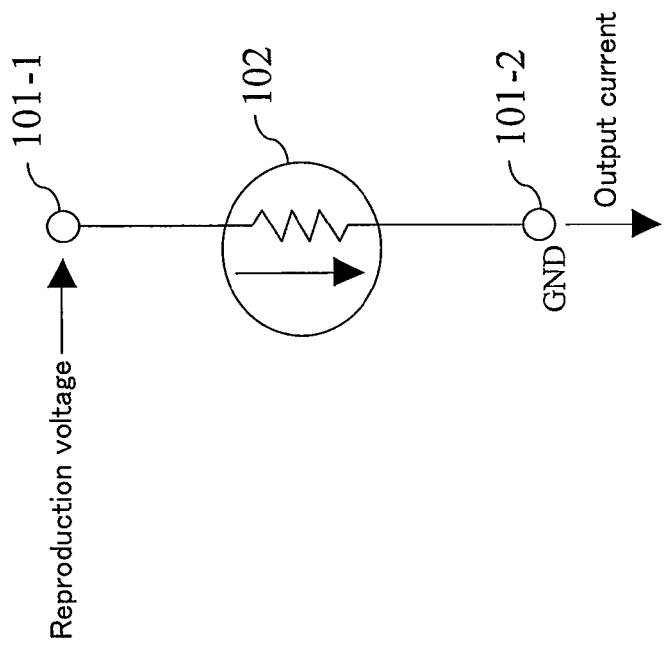

Referring to FIG. 11, when a voltage which does not affect the change in resistance of the electric element (reproduction voltage) is applied, an output current flows according to the resistance value of the electric element 102. Namely, when the resistance value of the electric element 102 is "Ra", an output current which has current value "Ia" flows. When the resistance value of the electric element 102 is "Rb", an output current which has current value "Ib" flows.

<Operation>

Next, the operation of the electric element 102 shown in FIG. 9 is described. Herein, the electric element 102 is used as a memory to perform a process of 1-bit data. It is assumed that the resistance value of the electric element 102 is initialized to a high resistance state. It is further assumed that when the resistance value of the electric element 102 is at "high resistance state", the logical value is "0", and that when the resistance value of the electric element 102 is at "low resistance state", the logical value is "1".

[Memorization]

To write 1-bit data representing "1" in the electric element 102, as illustrated in FIG. 10, the terminal 101-2 is pulled down to the ground, and a memorization voltage is applied to the terminal 101-1. The memorization voltage is, for example, an electric pulse which has a voltage value of +2.5 V and a pulse width of 100 nsec. Since the positive pulse is applied to the electric element 102, the resistance value of the electric element 102 results in the low resistance state. In this way, 1-bit data representing "1" is stored in the electric element 102.

[Reset]

To reset the memory state of the electric element 102 to the initial state, the terminal 101-2 is pulled down to the ground, and a reset voltage is applied to the terminal 101-1. The reset voltage is, for example, an electric pulse which has a voltage value of −2.5 V and a pulse width of 100 nsec. Since the negative pulse is applied to the electric element 102, the resistance value of the electric element 102 returns to the high resistance state. In this way, the memory state of the electric element 102 is returned to the initial state.

[Reproduction]

To read data from the electric element 102, the terminal 101-2 is pulled down to the ground, and a reproduction voltage is applied to the terminal 101-1 as shown in FIG. 11. The reproduction voltage is, for example, a voltage which has a voltage value of +0.5 V. Since the reproduction voltage is applied to the electric element 102, an electric current which has a current value determined according to the resistance value of the electric element 102 flows between the terminal 101-1 and the terminal 101-2. Then, the resistance value of the electric element 102 is calculated based on the current value of the current flowing between the terminal 101-1 and the terminal 101-2 and the voltage value of the reproduction voltage. Assuming herein that the resistance value of the electric element 102 indicative of "high resistance state" corresponds to "0" and the resistance value of the electric element 102 indicative of "low resistance state" corresponds to "1", the above current flow means reproduction of 1-bit data from the electric element 102.

<Effects>

As described above, the electric element can be used as a memory. The electric element exhibits stable changes in resistance even after repetitive application of electric pulses and therefore achieves stable memorization and reproduction as compared with prior art. The material of the variable-resistance film of the memory is not amorphous but has a microcrystalline structure. Therefore, the reliability of the electric element as the memory can be maintained even after hours of use as compared with conventional memory devices.

The voltages applied to the terminal 101-1 and the terminal 101-2 are not limited to the values shown above. The same effects are achieved by applying, for memorization, voltages to the terminal 101-1 and the terminal 101-2 such that a positive pulse is applied to the electric element. Likewise, the same effects are also achieved by applying, for reset, voltages to the terminal 101-1 and the terminal 101-2 such that a negative pulse is applied to the electric element. This basically applies to reproduction.

In this embodiment, values are allocated to two states of resistance for reading and writing "1-bit" data. Alternatively, values may be uniquely allocated to three or more states of resistance for reading and writing "multi-bit" data. In this case, the voltage value of a pulse voltage to be applied or the number of applications of the pulse voltage may be adjusted according to the value of the multi-bit data.

Embodiment 2

<General Structure>

Figure 12:
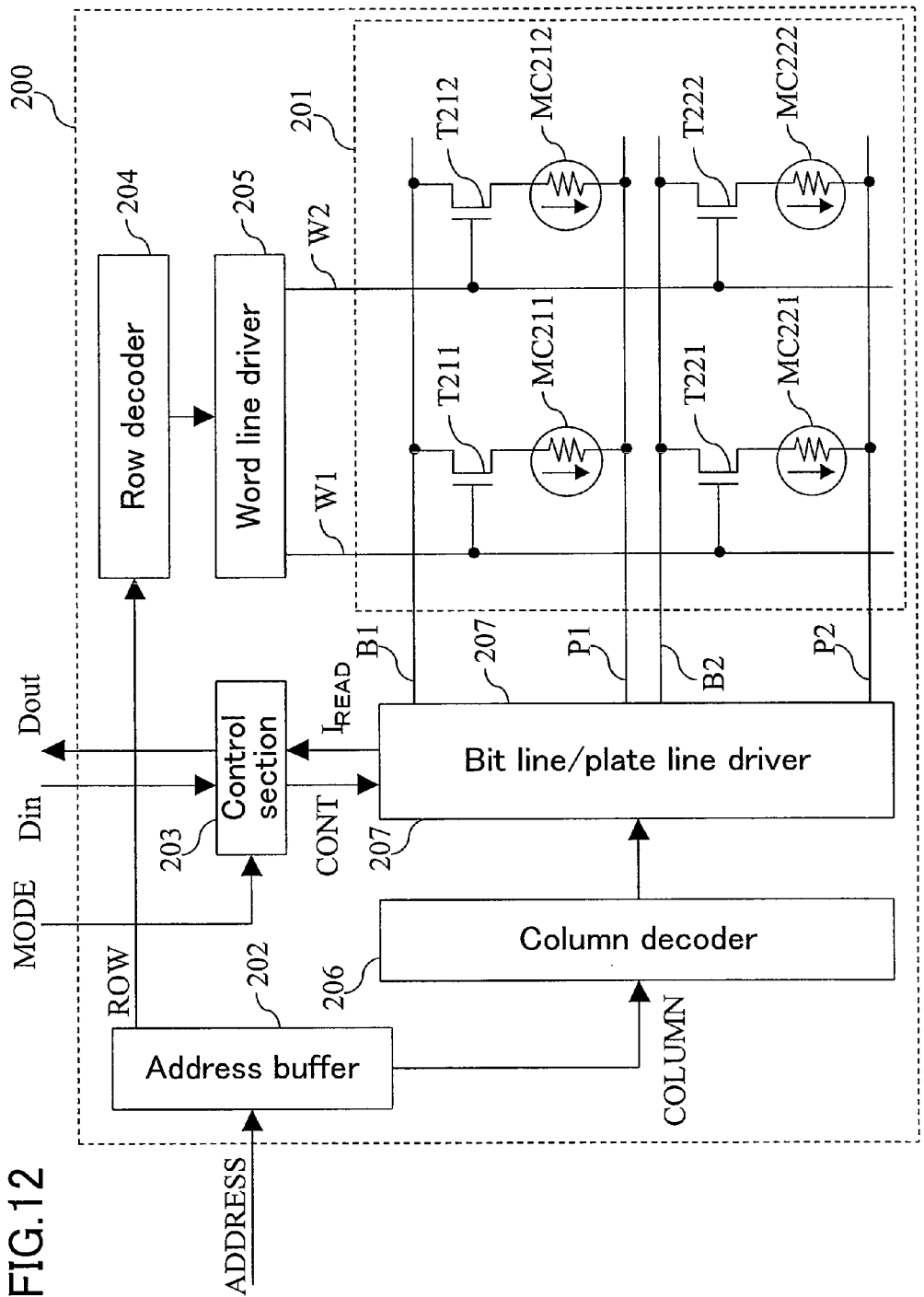
FIG. 12 shows a general structure of a memory device according to embodiment 2 of the present invention.

The general structure of a memory device 200 according to embodiment 2 of the present invention is shown in FIG. 12. The memory device 200 includes a memory array 201, an address buffer 202, a control section 203, a row decoder 204, a word line driver 205, a column decoder 206, and a bit line/plate line driver 207.

The memory array 201 includes word lines W1 and W2, bit lines B1 and B2, plate lines P1 and P2, transistors T211, T212, T221 and T222, and memory cells MC211, MC212, MC221 and MC222. Each of the memory cells MC211, MC212, MC221 and MC222 is the electric element 102 shown in FIG. 9.

The respective connections of the transistors T211 through T222 and the memory cells MC211 through MC222 are equal, and hence, the connection of the transistor T211 and the memory cell MC211 is described as a representative pair. The transistor T211 and the memory cell MC211 are connected in series between the bit line B1 and the plate line P1. The transistor T211 is connected between the bit line B1 and the memory cell MC211, and the gate of the transistor T211 is connected to the word line W1. The memory cell MC211 is connected between the transistor T211 and the plate line P1. Each of the transistors T211 through T222 is rendered conductive when a predetermined voltage (activation voltage) is applied to a word line corresponding to the transistor.

The address buffer 202 receives address signal ADDRESS supplied from the outside of the memory device 200 to output row address signal ROW to the row decoder 204 and output column address signal COLUMN to the column decoder 206. Address signal ADDRESS indicates an address of a memory cell selected from the memory cells MC211, MC212, MC221 and MC222. Row address signal ROW indicates the row address of the address indicated by address signal ADDRESS. Column address signal COLUMN indicates the column address of the address indicated by address signal ADDRESS.

The control section 203 enters any one of memorization mode, reset mode, and reproduction mode according to mode selection signal MODE supplied from the outside of the memory device 200. In the memorization mode, the control section 203 outputs a control signal CONT which indicates "application of memorization voltage" to the bit line/plate line driver 207 according to input data Din supplied from the outside of the memory device 200. In the reproduction mode, the control section 203 outputs a control signal CONT which indicates "application of reproduction voltage" to the bit line/ plate line driver 207. In the reproduction mode, the control section 203 outputs to an external device output data Dout indicative of a bit value which is determined according to signal $I_{READ}$ received from the bit line/plate line driver 207. Signal $I_{READ}$ indicates the current value of an electric current flowing through the plate lines P1 and P2 in the reproduction mode. In the reset mode, the control section 203 checks the memory state of the memory cells MC211 through MC222 and outputs a control signal CONT which indicates "application of reset voltage" to the bit line/plate line driver 207 according to the checked memory state.

The row decoder 204 selects any one of the word lines W1 and W2 according to row address signal ROW received from the address buffer 202.

The word line driver 205 applies the activation voltage to a word line selected by the row decoder 204.

The column decoder 206 selects any one of the bit lines B1 and B2 and any one of the plate lines P1 and P2 according to column address signal COLUMN received from the address buffer 202.

When receiving the control signal CONT which indicates "application of memorization voltage" from the control section 203, the bit line/plate line driver 207 applies memorization voltage $V_{WRITE}$ to the bit line selected by the column decoder 206 and pulls the plate line selected by the column decoder 206 to the ground. When receiving the control signal CONT which indicates "application of reproduction voltage" from the control section 203, the bit line/plate line driver 207 applies reproduction voltage $V_{READ}$ to the bit line selected by the column decoder 206 and pulls the plate line selected by the column decoder 206 to the ground. Thereafter, the bit line/plate line driver 207 outputs to the control section 203 signal $I_{READ}$ which indicates the current value of an electric current flowing through the plate line. When receiving the control signal CONT which indicates "application of reset voltage" from the control section 203, the bit line/plate line driver 207 applies reset voltage $V_{RESET}$ to the bit line selected by the column decoder 206 and pulls the plate line selected by the column decoder 206 to the ground.

Memorization voltage $V_{WRITE}$ is an electric pulse which has, for example, a voltage value of +2.5 V and a pulse width of 100 nsec. Reproduction voltage $V_{READ}$ is a voltage which has, for example, a voltage value of +0.5 V. Reset voltage $V_{RESET}$ is an electric pulse which has, for example, a voltage value of −2.5 V and a pulse width of 100 nsec.

<Operation>

Next, an operation of the memory device 200 shown in FIG. 12 is described. The operation modes of the memory device 200 include the memorization mode where input data Din is written in a memory cell, the reset mode where information written in a memory cell is reset, and the reproduction mode where information written in a memory cell is output (reproduced) as output data Dout. It is assumed herein that the memory cells MC211 through MC222 are initialized to the high resistance state. It is further assumed that address signal ADDRESS indicates the address of the memory cell MC211.

[Memorization Mode]

In the first place, the operation in the memorization mode is described.

When input data Din represents "1", the control section 203 outputs a control signal CONT which indicates "application of memorization voltage" to the bit line/plate line driver 207. When input data Din represents "0", the control section 203 does not output a control signal CONT.

Receiving the control signal CONT which indicates "application of memorization voltage" from the control section 203, the bit line/plate line driver 207 applies memorization voltage $V_{WRITE}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that an electric pulse (positive pulse) which has a voltage value of +2.5 V and a pulse width of 100 nsec is applied to the memory cell MC211, the resistance value of the memory cell MC211 results in the low resistance state.

Since the positive pulse is not applied to the memory cell MC212, MC221 or MC222, the resistance states of the memory cells MC212, MC221 and MC222 do not change.

Thus, since only the resistance state of the memory cell MC211 changes to the "low resistance state", 1-bit data representing "1" is written in the memory cell MC211.

After the writing of data in the memory cell MC211 has been completed, new address signal ADDRESS is input to the address buffer 202, and the above-described operation in the memorization mode is repeated.

[Reproduction Mode]

Next, the operation in the reproduction mode is described.

The control section 203 outputs a control signal CONT which indicates "application of reproduction voltage" to the bit line/plate line driver 207.

Receiving the control signal CONT which indicates "application of reproduction voltage" from the control section 203, the bit line/plate line driver 207 applies reproduction voltage $V_{READ}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that a voltage (measurement voltage) which has a voltage value of 0.5 V is applied to the memory cell MC211, an electric current having a current value determined according to the resistance value of the memory cell MC211 flows through the memory cell MC211 and then flows out to the bit line B1.

Since the measurement voltage is not applied to the memory cell MC212, MC221 or MC222, no current flows through the memory cells MC212, MC221 or MC222.

Then, the bit line/plate line driver 207 measures the current value of an electric current flowing through the plate line P1 and outputs to the control section 203 signal $I_{READ}$ which indicates the measured current value. The control section 203 then outputs to an external device output data Dout which is determined according to the current value indicated by signal $I_{READ}$. For example, if the measured current value is a current value of an electric current which flows in the case of the low resistance state, output data Dout which is output from the control section 203 represents "1".

Thus, since an electric current flows only through the memory cell MC211 and the electric current flows out to the plate line P1, 1-bit data is read from the memory cell MC211.

After the reading of data from the memory cell MC211 has been completed, new address signal ADDRESS is input to the address buffer 202, and the above-described operation in the reproduction mode is repeated.

[Reset Mode]

Next, the operation in the reset mode is described.

The control section 203 checks the memory state of the memory cell MC211 through the process of the reproduction mode.

In the case where the control section 203 determines that the memory cell MC211 stores bit data representing "1" (the memory cell MC211 is at the low resistance state), the control section 203 outputs a control signal CONT which indicates "application of reset voltage" to the bit line/plate line driver 207. In the case where the memory cell MC211 stores bit data representing "0" (the memory cell MC211 is at the high resistance state), the control section 203 does not output a control signal CONT.

Receiving the control signal CONT which indicates "application of reset voltage" from the control section 203, the bit line/plate line driver 207 applies reset voltage $V_{RESET}$ to the bit line B1 selected by the column decoder 206 and pulls the plate line P1 selected by the column decoder 206 to the ground.

In the meantime, the word line driver 205 applies the activation voltage to the word line W1 selected by the row decoder 204.

Since the above conditions mean that an electric pulse (negative pulse) which has a voltage value of −2.5 V and a pulse width of 100 nsec is applied to the memory cell MC211, the resistance value of the memory cell MC211 results in the high resistance state.

Since the negative pulse is not applied to the memory cell MC212, MC221 or MC222, the resistance states of the memory cells MC212, MC221 and MC222 do not change.

Thus, since only the resistance state of the memory cell MC211 changes to the "high resistance state", 1-bit data stored in the memory cell MC211 is reset.

After the resetting of the memory cell MC211 has been completed, new address signal ADDRESS is input to the address buffer 202, and the above-described operation in the reset mode is repeated.

<Effects>

As described above, the electric element can be used as a memory array. The material of the variable-resistance film of the memory is not amorphous but has a microcrystalline structure. Therefore, the reliability of the electric element as the memory array can be maintained even after hours of use as compared with conventional memory devices.

FIG. 12 shows only four memory cells but the present invention is not limited thereto. For example, 5 or more memory cells may be arranged in a matrix.

Embodiment 3

<Structure>

Figure 13:
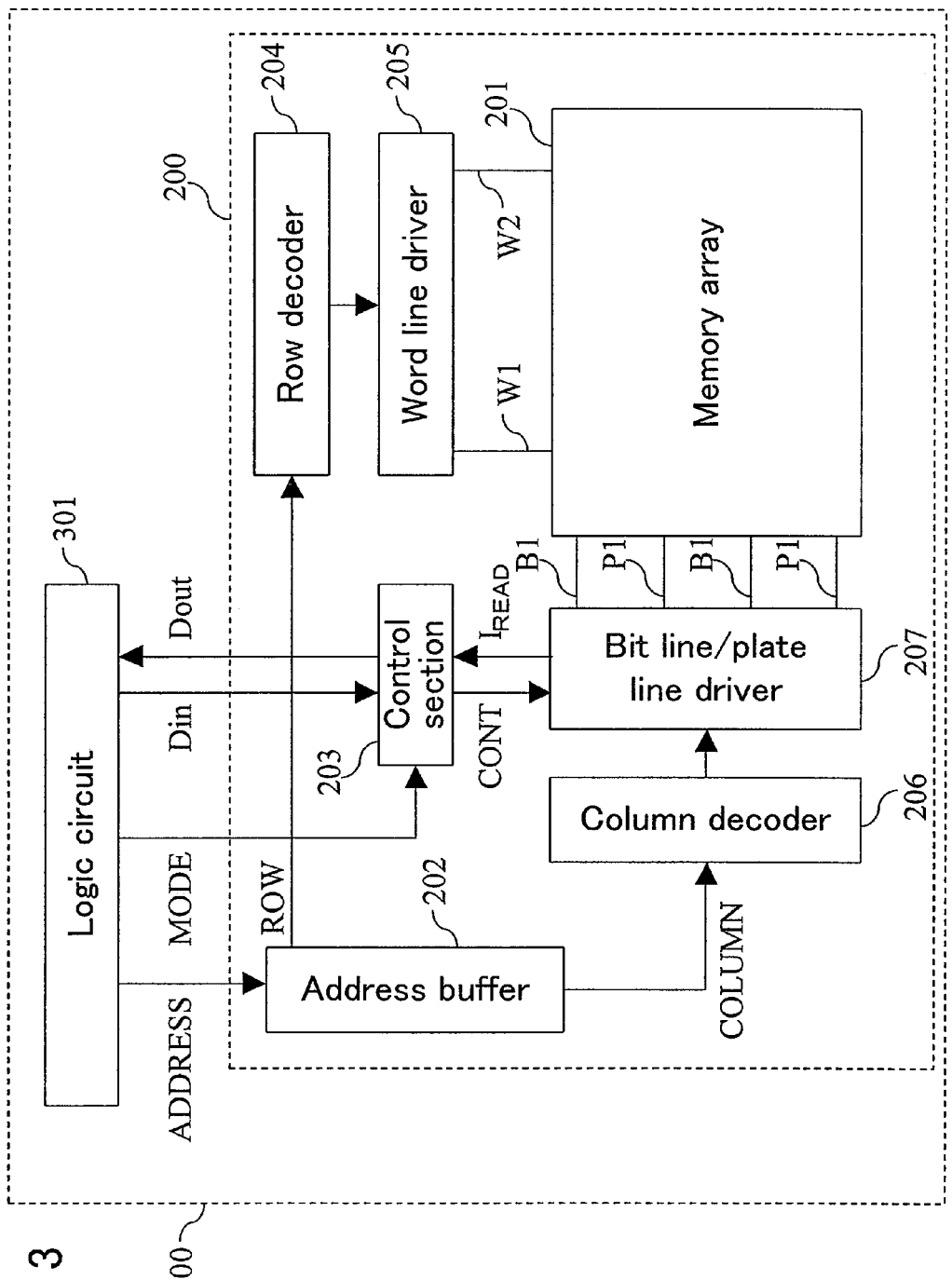
FIG. 13 shows a general structure of a semiconductor integrated circuit according to embodiment 3 of the present invention.

The structure of a semiconductor integrated circuit (Embedded-RAM) 300 according to embodiment 3 of the present invention is shown in FIG. 13. The circuit 300 includes the memory device 200 shown in FIG. 12 and a logic circuit 301 and is formed as a single semiconductor chip. The memory device 200 is used as a data RAM. The logic circuit 301 is a circuit which performs a predetermined operation (e.g., encoding or decoding of sound data or image data) and uses the memory device 200 in the operation. The logic circuit 301 controls address signal ADDRESS and mode selection signal MODE which are supplied to the memory device 200 to write data in or read data from the memory device 200.

<Operation>

Next, the operation of the semiconductor integrated circuit (Embedded-RAM) 300 shown in FIG. 13 is described. The operation of the circuit 300 includes a write process for writing predetermined data (bit data) in the memory device 200, a read process for reading data written in the memory device 200, and a reset process for resetting data written in the memory device 200.

[Write Process]

In the first place, the write process is described.

To write predetermined data (for example, encoded moving picture data, or the like) in the memory device 200, the logic circuit 301 outputs a mode selection signal MODE which indicates "memorization mode" to the control section 203 of the memory device 200.

Then, to select memory cells in which the predetermined data is to be written, the logic circuit 301 sequentially outputs address signals ADDRESS to the address buffer 202 of the memory device 200. As a result, in the memory device 200, memory cells are sequentially selected according to address signals ADDRESS.

Then, the logic circuit 301 outputs the predetermined data on a bit-by-bit basis as 1-bit data Din to the control section 203 of the memory device 200.

Then, in the memory device 200, the same operation as that of the memorization mode of embodiment 2 is performed. As a result, the predetermined data is written in the memory device 200 on a bit-by-bit basis.

[Read Process]

Next, the read process is described.

To read data written in the memory device 200, the logic circuit 301 outputs a mode selection signal MODE which indicates "reproduction mode" to the control section 203 of the memory device 200.

Then, to select memory cells from which written data is to be read, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reproduction mode of embodiment 2 is performed. As a result, the data stored in the memory device 200 is read on a bit-by-bit basis as output data Dout.

[Reset Process]

Next, the reset process is described.

To reset data written in the memory device 200, the logic circuit 301 outputs a mode selection signal MODE which indicates "reset mode" to the control section 203 of the memory device 200.

Then, to select memory cells in which stored data is to be reset, the logic circuit 301 sequentially outputs address signals ADDRESS to the address buffer 202 of the 1 5 memory device 200. As a result, in the memory device 200, memory cells are sequentially selected according to address signals ADDRESS.

Then, in the memory device 200, the same operation as that of the reset mode of embodiment 2 is performed. As a result, the data stored in the memory device 200 is reset on a bit-by-bit basis.

<Effects>

As described above, a large amount of information can be stored quickly in the memory device.

Embodiment 4

<Structure>

Figure 14:
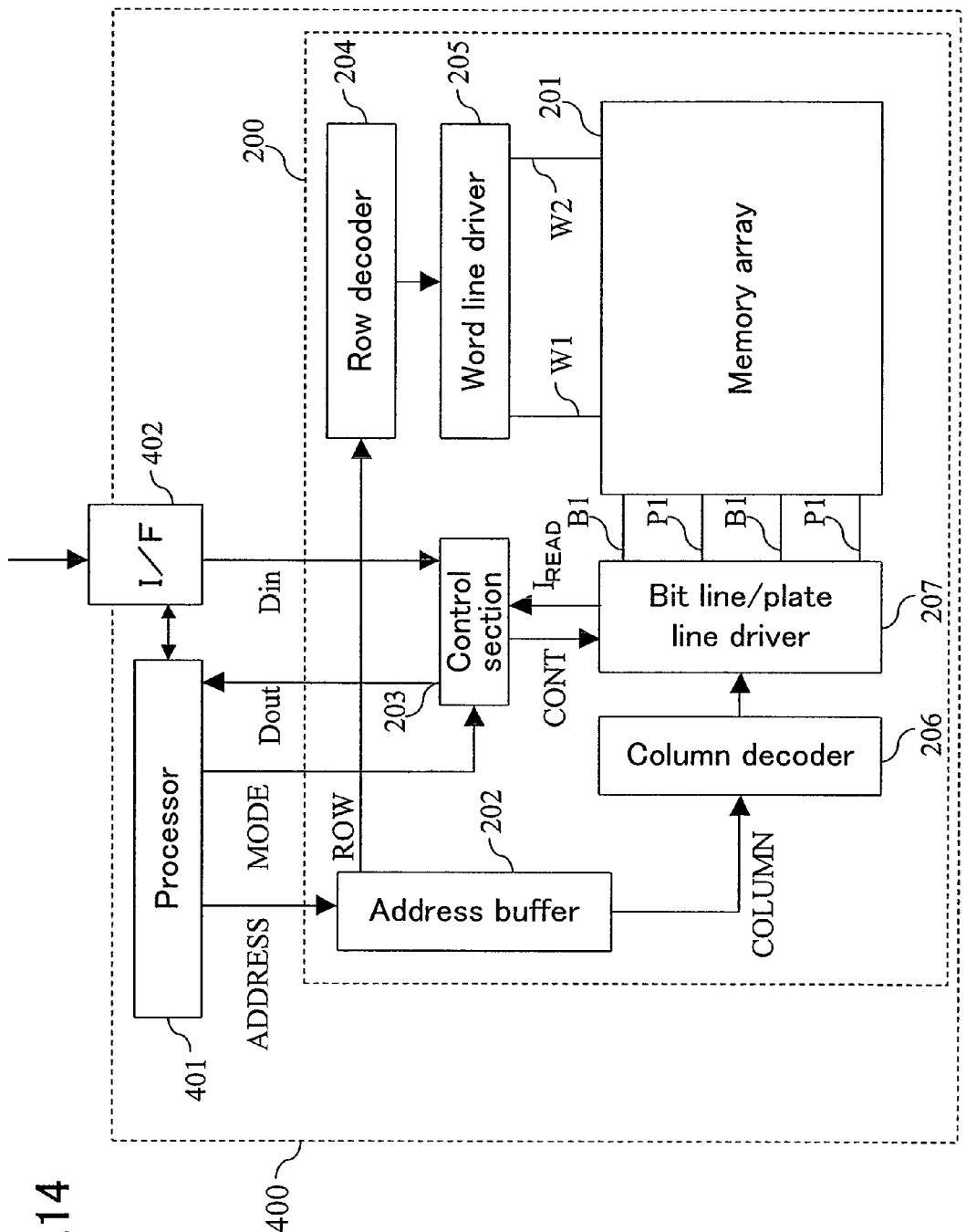
FIG. 14 shows a general structure of a semiconductor integrated circuit according to embodiment 4 of the present invention.

The structure of a semiconductor integrated circuit (reconfigurable LSI) 400 according to embodiment 4 of the present invention is shown in FIG. 14. The circuit 400 includes the memory device 200 shown in FIG. 12, a processor 401 and an interface 402 and is formed as a single semiconductor chip. The memory device 200 is used as a program ROM to store a program necessary for the operation of the processor 401. The processor 401 operates according to the program stored in the memory device 200 to control the memory device 200 and the interface 402. The interface 402 sequentially outputs to the memory device 200 a program supplied from an external device.

<Operation>

Next, the operation of the semiconductor integrated circuit (reconfigurable LSI) 400 shown in FIG. 14 is described. The operation of the circuit 400 includes a program execution process wherein the circuit 400 operates according to a stored program and a program rewrite process for rewriting the program stored in the memory device 200 to another new program.

[Program Execution Process]

In the first place, the program execution process is described.

To read a program stored in the memory device 200, the processor 401 outputs a mode selection signal MODE which indicates "reproduction mode" to the control section 203 of the memory device 200.

Then, the processor 401 sequentially outputs to the address buffer 202 of the memory device 200 address signals ADDRESS indicative of memory cells in which the required program is stored. As a result, in the memory device 200, memory cells are sequentially selected according to address signals ADDRESS.

Then, in the memory device 200, the same operation as that of the reproduction mode of embodiment 2 is performed. As a result, the program stored in the memory device 200 is read on a bit-by-bit basis as output data Dout.

Then, the processor 401 performs a predetermined operation according to the program read from the memory device 200.

[Program Rewrite Process]

Next, the program rewrite process is described.

To erase a program stored in the memory device 200 (a program which is to be rewritten), the processor 401 outputs a mode selection signal MODE which indicates "reset mode" to the control section 203 of the memory device 200.

Then, the processor 401 sequentially outputs to the address buffer 202 of the memory device 200 address signals ADDRESS indicative of memory cells storing the program to be rewritten. As a result, in the memory device 200, memory cells are sequentially selected according to address signals ADDRESS.

Then, in the memory device 200, the same operation as that of the reset mode of embodiment 2 is performed. As a result, the program stored in the memory cells is reset on a bit-by-bit basis.

After the completion of the resetting of the memory cells, the processor 401 outputs a mode selection signal MODE which indicates "memorization mode" to the control section 203 of the memory device 200 in order to write a new program.

Then, the processor 401 sequentially outputs to the address buffer 202 of the memory device 200 address signals ADDRESS which indicate the positions of memory cells in which a new program is to be stored. As a result, in the memory device 200, memory cells are sequentially selected according to address signals ADDRESS.

Then, the processor 401 outputs a new program supplied from an external device through the interface 402 to the control section 203 of the memory device 200 on a bit-by-bit basis. In the memory device 200, the same operation as that of the memorization mode of embodiment 2 is performed. As a result, the new program is stored in the memory device 200 on a bit-by-bit basis.

Thus, since the memory device 200 is a rewritable nonvolatile memory, it is possible to rewrite a program stored in the memory device 200. That is, the function realized in the processor 401 can be changed. Further, it is possible that a plurality of programs are stored in the memory device 200, and the function realized in the processor 401 can be changed according to a program read out from the memory device 200.

<Effects>

As described above, different functions can be realized with a single LSI, i.e., a reconfigurable LSI is realized.

In the above descriptions, the resistance state of the electric element can be changed when an applied electric pulse satisfies predetermined conditions. Thus, in the memorization and reset operations, an electric pulse which satisfies corresponding conditions is applied to the electric element, and in the reproduction operation, a voltage which does not satisfy the conditions is applied to the electric element, whereby the same effects can be achieved. That is, although in the above-described example the resistance state of the electric element changes from "high resistance state" to "low resistance state" when a positive pulse having a voltage value of +2.5 V and a pulse width of 100 nsec is applied, the same effects can be achieved even when the applied pulse voltage has a different voltage value and a different pulse width. Depending on the method of forming which corresponds to initialization of the electric element, the resistance state of the electric element may change from "high resistance state" to "low resistance state" by application of a negative pulse.

Figure 15A:
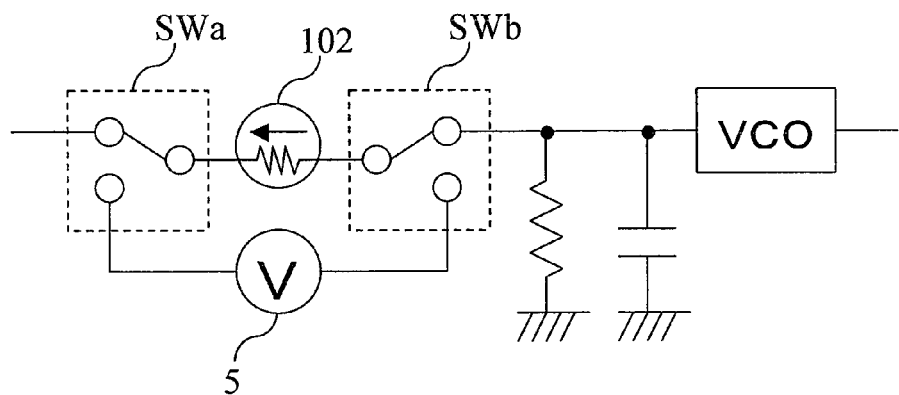
FIG. 15A shows an example of uses of an electric element.
Figure 15B:
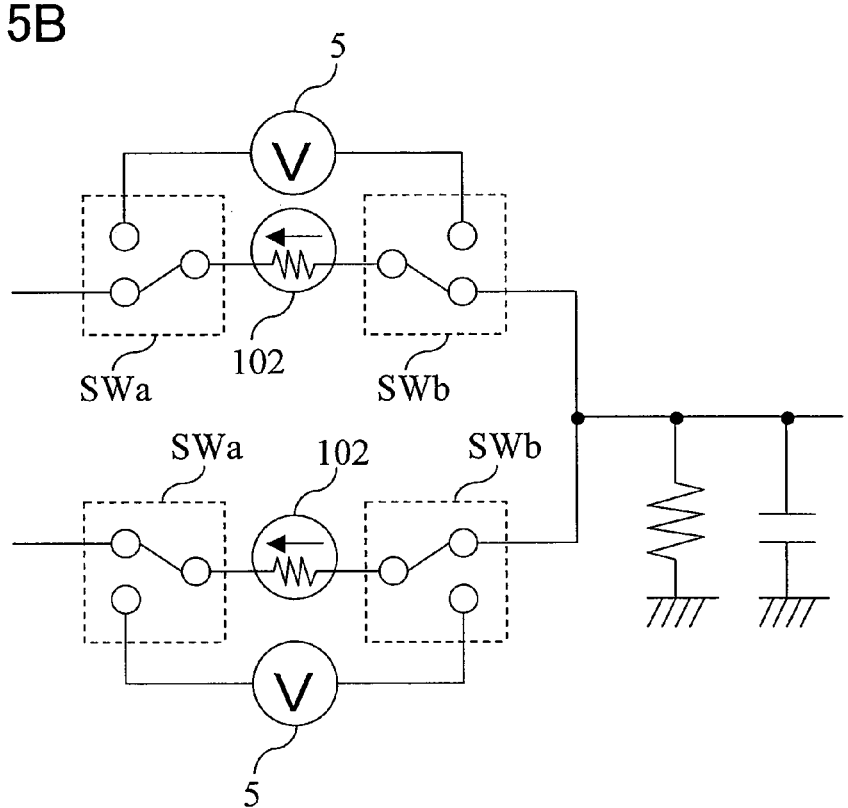
FIG. 15B shows another example of uses of an electric element.

Although in the above-described examples of the embodiments an electric element of the present invention is used as a "memory device", the present invention is not limited to this use. For example, an electric element of the present invention can be used as a switching element for switching a plurality of signals, a variable-resistance element used for switching the frequency (see FIG. 15A), a variable-resistance element for determining the mixture ratio of signals (see FIG. 15B), a time constant changer element used in combination with a capacitor to determine the time constant, etc. For example, in FIG. 15A and FIG. 15B, in order to change the resistance value of the electric element 102, switches SWa and SWb are switched to electrically connect the electric element 102 and power supply 5. Then, the power supply 5 applies a predetermined electric pulse to the electric element 102, whereby the resistance value of the electric element 102 is changed. Then, the switches SWa and SWb are restored to the default connection state. In this way, the electric element 102 is used as a variable-resistance element to realize a frequency-variable circuit (FIG. 15A) and a mixing circuit for changing the mixture ratio (FIG. 15B).

INDUSTRIAL APPLICABILITY

An electric element of the present invention exhibits stable changes in resistance and is therefore useful for a nonvolatile memory, a variable-resistance element, etc.

The invention claimed is:

1. A memory device, comprising:
a plurality of word lines;
a plurality of bit lines;
a plurality of plate lines corresponding to the plurality of bit lines on a one-to-one basis;
a plurality of transistors;
a plurality of electric elements corresponding to the plurality of transistors on a one-to-one basis;
a word line driver for driving the plurality of word lines; and
a bit line/plate line driver for driving the plurality of bit lines and the plurality of plate lines,
wherein each of the plurality of transistors and one of the electric elements corresponding to the transistor are connected in series between any one of the plurality of bit lines and one of the plate lines corresponding to the bit line,
each of the plurality of transistors is connected between one of the bit lines corresponding to the transistor and one of the electric elements corresponding to the transistor, the transistor having a gate connected to any one of the plurality of word lines, each of the plurality of electric elements includes
- a first electrode connected to one of the transistors corresponding to the electric element,
- a second electrode connected to one of the plate lines corresponding to the electric element, and
- a variable-resistance film connected between the first electrode and the second electrode, and the variable-resistance film includes $Fe_3O_4$ as a constituent element and has a crystal grain size of 5 nm to 150 nm.

2. The electric element of claim 1 wherein, in order to memorize information in any one of the plurality of electric elements,
- the word line driver applies an activation voltage to one of the plurality of word lines connected to an electric element in which the information is to be memorized, and
- the bit line/plate line driver applies a first electric pulse to one of the plurality of bit lines connected to the electric element in which the information is to be memorized and applies a second electric pulse to one of the plate lines corresponding to the bit line.

3. The electric element of claim 1 wherein, in order to reproduce information memorized in any one of the plurality of electric elements,
- the word line driver applies an activation voltage to one of the plurality of word lines connected to an electric element from which the information is to be retrieved, and
- the bit line/plate line driver applies a first reproduction voltage to one of the plurality of bit lines connected to the electric element from which the information is to be retrieved and applies a second reproduction voltage to one of the plate lines corresponding to the bit line.

4. A semiconductor integrated circuit, comprising:
the memory device of claim 1; and
a logic circuit which has a memorization mode and a reproduction mode,
wherein in the memorization mode, the logic circuit stores bit data in the memory device, and
in the reproduction mode, the logic circuit reads bit data stored in the memory device.

5. A semiconductor integrated circuit, comprising:
the memory device of claim 1; and
a processor which has a program execution mode and a program rewrite mode,
wherein in the program execution mode, the processor operates according to a program stored in the memory device, and
in the program rewrite mode, the processor rewrites a program stored in the memory device to another new program received from outside.

6. A memory device, comprising:
a plurality of word lines;
a plurality of bit lines;
a plurality of plate lines corresponding to the plurality of bit lines on a one-to-one basis;
a plurality of transistors;
a plurality of electric elements corresponding to the plurality of transistors on a one-to-one basis;
a word line driver for driving the plurality of word lines; and
a bit line/plate line driver for driving the plurality of bit lines and the plurality of plate lines,
wherein each of the plurality of transistors and one of the electric elements corresponding to the transistor are connected in series between any one of the plurality of bit lines and one of the plate lines corresponding to the bit line,
each of the plurality of transistors is connected between one of the bit lines corresponding to the transistor and one of the electric elements corresponding to the transistor, the transistor having a gate connected to any one of the plurality of word lines,
each of the plurality of electric elements includes
- a first electrode connected to one of the transistors corresponding to the electric element,
- a second electrode connected to one of the plate lines corresponding to the electric element, and
- a variable-resistance film connected between the first electrode and the second electrode, and the variable-resistance film includes a $Fe_3O_4$ crystal phase and a $Fe_2O_3$ crystal phase and has a crystal grain size of 5 nm to 150 nm.

7. The electric element of claim 6 wherein, in order to memorize information in any one of the plurality of electric elements,
- the word line driver applies an activation voltage to one of the plurality of word lines connected to an electric element in which the information is to be memorized, and
- the bit line/plate line driver applies a first electric pulse to one of the plurality of bit lines connected to the electric element in which the information is to be memorized and applies a second electric pulse to one of the plate lines corresponding to the bit line.

8. The electric element of claim 6 wherein, in order to reproduce information memorized in any one of the plurality of electric elements,
- the word line driver applies an activation voltage to one of the plurality of word lines connected to an electric element from which the information is to be retrieved, and
- the bit line/plate line driver applies a first reproduction voltage to one of the plurality of bit lines connected to the electric element from which the information is to be retrieved and applies a second reproduction voltage to one of the plate lines corresponding to the bit line.

9. A semiconductor integrated circuit, comprising:
the memory device of claim 6; and
a logic circuit which has a memorization mode and a reproduction mode,
wherein in the memorization mode, the logic circuit stores bit data in the memory device, and
in the reproduction mode, the logic circuit reads bit data stored in the memory device.

10. A semiconductor integrated circuit, comprising:
the memory device of claim 6; and
a processor which has a program execution mode and a program rewrite mode,
wherein in the program execution mode, the processor operates according to a program stored in the memory device, and
in the program rewrite mode, the processor rewrites a program stored in the memory device to another new program received from outside.

* * * * *